United States Patent
Yoshida et al.

(10) Patent No.: US 11,134,592 B2
(45) Date of Patent: Sep. 28, 2021

(54) POWER CONVERSION DEVICE

(71) Applicant: TOSHIBA MITSUBISHI-ELECTRIC INDUSTRIAL SYSTEMS CORPORATION, Chuo-ku (JP)

(72) Inventors: Naohiro Yoshida, Tokyo (JP); Nobuhiro Takahashi, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 16/348,989

(22) PCT Filed: Nov. 28, 2016

(86) PCT No.: PCT/JP2016/085170
§ 371 (c)(1),
(2) Date: May 10, 2019

(87) PCT Pub. No.: WO2018/096677
PCT Pub. Date: May 31, 2018

(65) Prior Publication Data
US 2019/0274236 A1 Sep. 5, 2019

(51) Int. Cl.
*H05K 7/20* (2006.01)
*G06F 1/20* (2006.01)
(Continued)

(52) U.S. Cl.
CPC ......... *H05K 7/20945* (2013.01); *G06F 1/206* (2013.01); *H02M 7/003* (2013.01);
(Continued)

(58) Field of Classification Search
CPC ................................................. H05K 7/20209
(Continued)

(56) References Cited

U.S. PATENT DOCUMENTS 8,854,816 B2  10/2014  Shintani
2010/0291850 A1*  11/2010  Sabbaghian .......... B08B 15/002
454/61
(Continued)

FOREIGN PATENT DOCUMENTS

CN  104582380 A  4/2015
CN  105650022 A  6/2016
(Continued)

OTHER PUBLICATIONS

Honda, English translation of JPH03175484A, 1991, EPO, pp. 2 (Year: 1991).*
(Continued)

*Primary Examiner* — Suresh Suryawanshi
(74) *Attorney, Agent, or Firm* — Oblon, McClelland, Maier & Neustadt, L.L.P.

(57) ABSTRACT

A power conversion device capable of suppressing air from flowing back into a housing is provided. The power conversion device includes a power conversion unit configured to perform power conversion, a housing for accommodating the power conversion and having an air inlet and an air outlet, a fan provided inside the housing and generating airflow in such a manner that air flows to the outside of the housing via the air outlet after flowing into the housing via the air inlet, and a cover provided at the air outlet, the cover being configured to be brought into an opened state with respect to the air outlet if the airflow generated by the fan is stronger than airflow moving from the outside of the housing toward the air outlet, and to be brought into a closed state with respect to the air outlet if the airflow generated by the fan is weaker than the airflow moving from the outside of the housing toward the exhaust of the housing.

3 Claims, 7 Drawing Sheets

(51) Int. Cl.
*H02M 7/00* (2006.01)
*H02M 7/48* (2007.01)
(52) U.S. Cl.
CPC ............... *H02M 7/48* (2013.01); *H05K 7/20* (2013.01); *H05K 7/20909* (2013.01); *G05B 2219/2614* (2013.01)
(58) Field of Classification Search
USPC ....................................................... 700/300
See application file for complete search history.

(56) References Cited

U.S. PATENT DOCUMENTS

| | | | |
|---|---|---|---|
| 2011/0036554 A1 | 2/2011 | Scheidler et al. | |
| 2012/0008286 A1* | 1/2012 | Suzuki | B60L 50/16 361/730 |
| 2012/0242976 A1* | 9/2012 | Lepaysan | G01N 15/0205 356/28.5 |
| 2014/0074312 A1* | 3/2014 | Bates | G05D 23/1393 700/299 |
| 2016/0037677 A1* | 2/2016 | Yamanaka | H05K 7/20918 361/697 |
| 2019/0208671 A1* | 7/2019 | Kitanaka | H05K 7/20909 |

FOREIGN PATENT DOCUMENTS

| | | | |
|---|---|---|---|
| JP | 3-175484 A | | 7/1991 |
| JP | 2003-70259 A | | 3/2003 |
| JP | 2004-281489 A | | 10/2004 |
| JP | 2007-250596 A | | 9/2007 |
| JP | 2008-103637 A | | 5/2008 |
| JP | 2012-5242 A | | 1/2012 |
| JP | 2013125865 A | * | 6/2013 |
| JP | 2016-146737 A | | 8/2016 |

OTHER PUBLICATIONS

Japanese Office Action dated Jan. 21, 2020, in Patent Application No. 2018-552370, 5 pages (with unedited computer generated English translation).
International Search Report dated Dec. 27, 2016 in PCT/JP2016/085170 filed Nov. 28, 2016.
International Preliminary Report on Patentability and Written Opinion dated May 28, 2019 (submitting English translation only).
Indian Office Action dated Sep. 29, 2020 in Indian Patent Application No. 201917024640, 6 pages.
European Office Action dated Jul. 10, 2020 in European Patent Application No. 16922473.0, 16 pages.
Combined Chinese Office Action dated Jul. 1, 2020 in Chinese Patent Application No. 201680091093.0 (with English translation), 14 pages.
Extended European Search Report dated Oct. 13, 2020 in European Patent Application No. 16922473.0, 14 pages.
Office Action dated May 13, 2021 issued in corresponding Chinese patent application No. 201680091093.0 (with English translation).

* cited by examiner

POWER CONVERSION DEVICE

FIELD

The present invention relates to a power conversion device.

BACKGROUND

PTL 1 discloses a power conversion device. The power conversion device includes a power conversion unit and a fan. The power conversion unit performs power conversion. A housing accommodates the power conversion unit. The fan generates airflow by rotating. The power conversion unit is cooled by the airflow.

CITATION LIST

Patent Literature

[PTL 1] JP 2012-005242 A

SUMMARY

Technical Problem

However, when the power conversion device discussed in PTL 1 is provided outdoors, wind from the outside of the housing may flow back into the housing. In this case, the power conversion unit is not cooled appropriately.

The present invention has been made to solve the above-mentioned problem. An object of the present invention is to provide a power conversion device capable of suppressing backflow of air into the housing.

Solution to Problem

A power conversion device according to the present invention includes a power conversion unit configured to perform power conversion, a housing accommodating the power conversion and having an air inlet and an air outlet, a fan provided inside the housing to generate airflow in such a manner that air flows to the outside of the housing via the air outlet after flowing into the housing via the air inlet, and a cover provided at the air outlet, the cover being configured to be brought into an opened state with respect to the air outlet if the airflow generated by the fan is stronger than airflow moving from the outside of the housing toward the air outlet, and to be brought into a closed state with respect to the air outlet if the airflow generated by the fan is weaker than the airflow moving from the outside of the housing toward the exhaust of the housing.

A power conversion device according to the present invention includes a power conversion unit configured to perform power conversion, a housing accommodating the power conversion and having an air inlet and an air outlet, a fan provided inside the housing to generate airflow in such a manner that air flows to the outside of the housing via the air outlet after flowing into the housing via the air inlet, a wind speed measurement device configured to measure the wind speed outside the housing, and a control device configured to, when the wind speed measurement device has measured the wind speed, control the rotation speed of the fan based on the wind speed.

Advantageous Effects of Invention

According to these inventions, the airflow from the fan is variable depending on wind outside the housing. Therefore, it is possible to suppress air from flowing back into the housing.

DESCRIPTION OF EMBODIMENTS

Figure 1:
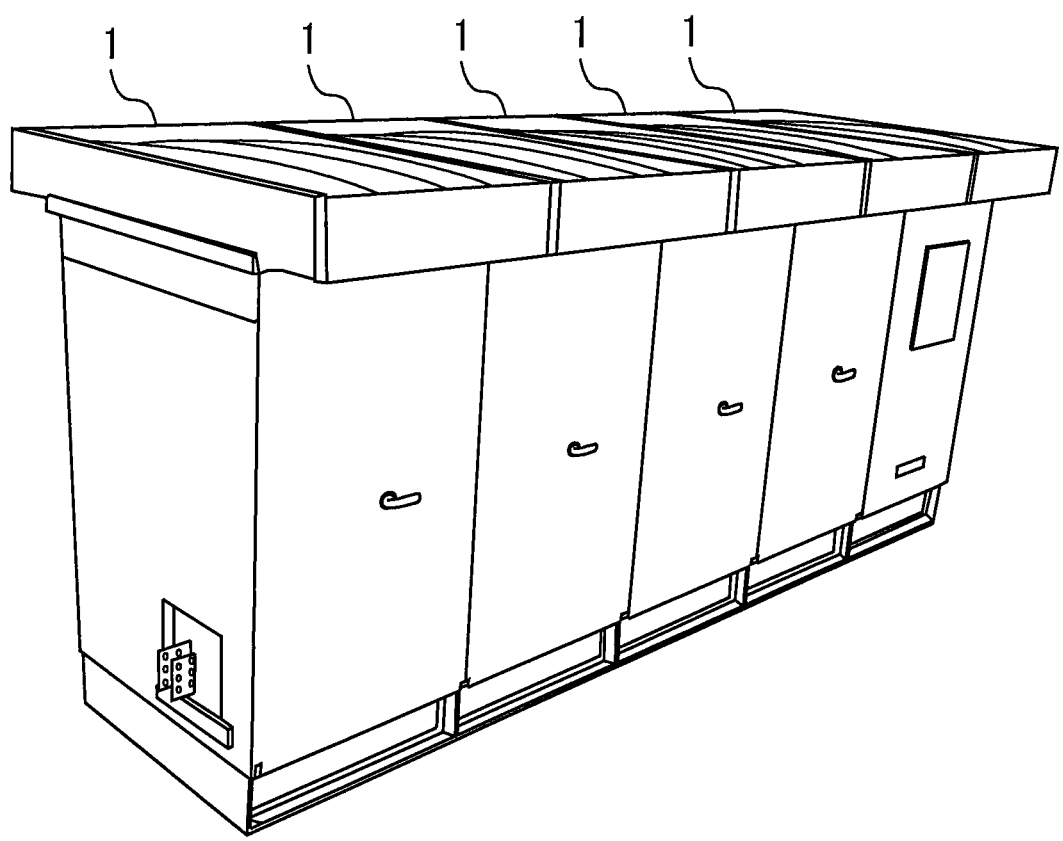
FIG. 1 is a perspective view illustrating a power conversion device according to a first embodiment of the present invention.

Embodiments of the present invention will be described with reference to attached drawings. In the drawings, the same or corresponding parts are denoted by the same reference numerals. Duplicated explanations of these parts will be simplified or omitted appropriately.

First Embodiment

FIG. 1 is a perspective view illustrating a power conversion device according to a first embodiment of the present invention.

In FIG. 1, a plurality of power conversion devices 1 is provided outdoors. The plural power conversion devices 1 are adjacent to each other.

Next, airflow will be described with reference to FIGS. 2 to 4.

Figure 2:
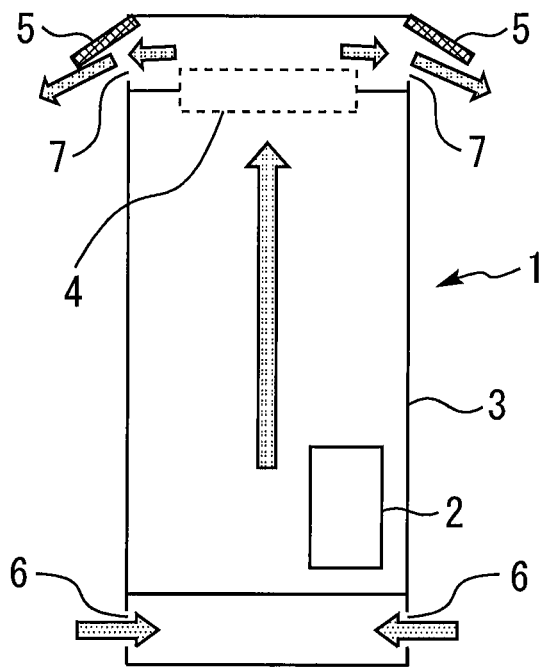
FIG. 2 is a diagram illustrating a longitudinal section of an essential part of the power conversion device according to the first embodiment of the present invention.
Figure 3:
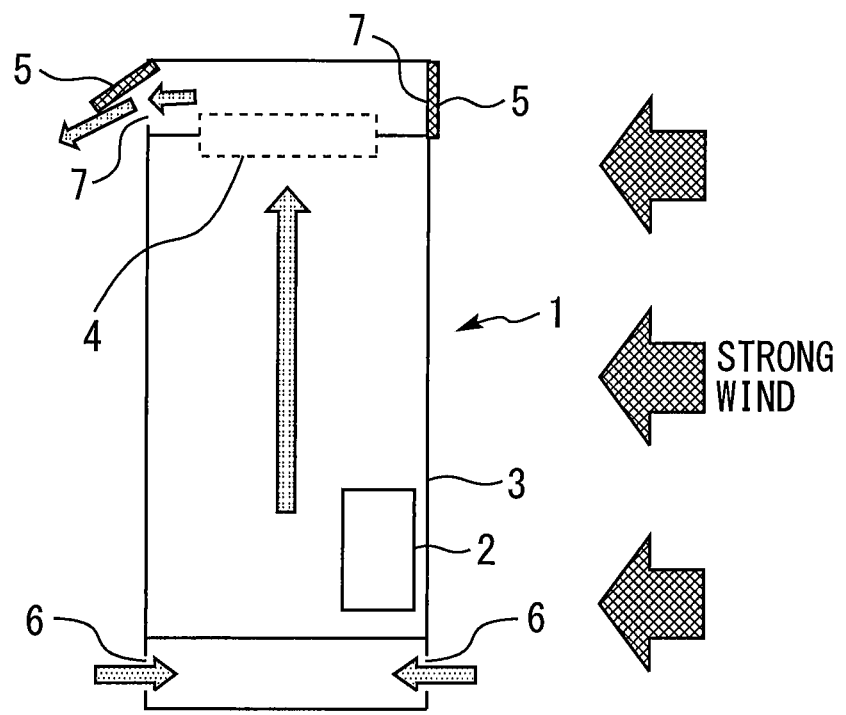
FIG. 3 is a diagram illustrating a longitudinal section of the essential part of the power conversion device according to the first embodiment of the present invention.
Figure 4:
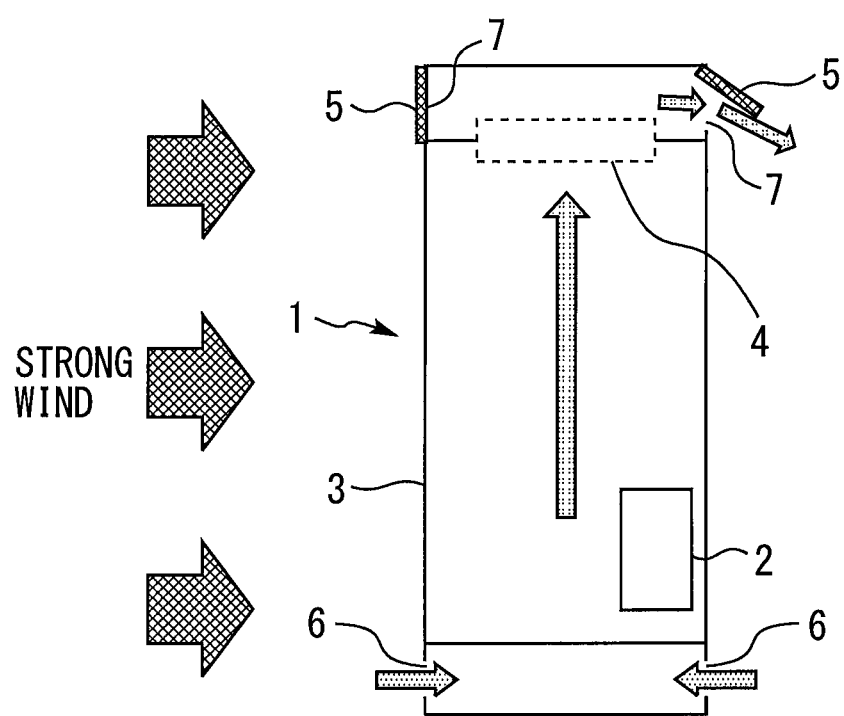
FIG. 4 is a diagram illustrating a longitudinal section of the essential part of the power conversion device according to the first embodiment of the present invention.

FIGS. 2 to 4 are diagrams illustrating longitudinal sections of an essential part of the power conversion device according to the first embodiment of the present invention.

As illustrated in FIG. 2, each of the plurality of power conversion devices 1 includes a power conversion unit 2, a housing 3, a fan 4, and a pair of covers 5.

For example, an input part of the power conversion unit 2 is electrically connected to an output part of a solar panel (not illustrated). For example, an output part of the power conversion unit 2 is electrically connected to a power system (not illustrated).

For example, the outer shape of the housing 3 is formed into a rectangular parallelepiped shape. The housing 3 accommodates the power conversion unit 2. For example, the housing 3 accommodates the power conversion unit 2 on one side thereof. For example, the housing 3 has a pair of air inlets 6 and a pair of air outlets 7.

One of the pair of air inlets 6 is provided at a lower portion on the front side of the housing 3. For example, one of the pair of air inlets 6 is formed into a rectangular shape. For example, one of the pair of air inlets 6 has its longer direction as the horizontal direction. The other of the pair of air inlets 6 is provided at a lower portion on the rear side of the housing 3. For example, the other of the pair of air inlets 6 is formed into a rectangular shape. For example, the other of the pair of air inlets 6 has its longer direction as the horizontal direction.

One of the pair of air outlets 7 is provided at an upper portion on the front side of the housing 3. For example, one of the pair of air outlets 7 is formed into a rectangular shape. For example, one of the pair of air outlets 7 has its longer direction as the horizontal direction. The other of the pair of air outlets 7 is provided at an upper portion on the rear side of the housing 3. For example, the other of the pair of air outlets 7 is formed into a rectangular shape. For example, the other of the pair of air outlets 7 has its longer direction as the horizontal direction.

The fan 4 is provided inside the housing 3. For example, the fan 4 is provided just under an upper surface of the housing 3.

One of the pair of covers 5 is provided at one of the pair of air outlets 7. For example, an upper edge of one of the pair of covers 5 is supported to be rotatable with respect to the housing 3. The other of the pair of covers 5 is provided at the other of the pair of air outlets 7. For example, an upper edge of the other of the pair of covers 5 is supported to be rotatable with respect to the housing 3.

In each power conversion device 1, the power conversion unit 2 performs power conversion. For example, the power conversion unit 2 receives DC power from the solar panel. The power conversion unit 2 converts the DC power into AC power. The power conversion unit 2 supplies the AC power to the power system.

At this time, the fan 4 generates airflow. As a result, outside air flows into the housing 3 via the pair of air inlets 6. Subsequently, the air passes through the fan 4. Thereafter, the air moves toward the pair of air outlets 7.

In a normal state, the generated airflow is stronger than airflow moving from the outside of the housing 3 toward one of the pair of air outlets 7. The generated airflow is stronger than airflow moving from the outside of the housing 3 toward the other of the pair of air outlets 7.

At this time, at one of the pair of air outlets 7, one of the pair of covers 5 is pushed toward the outside of the housing 3 by the airflow. As a result, one of the pair of covers 5 rotates about its upper edge. Therefore, one of the pair of covers 5 is brought into an opened state with respect to one of the pair of air outlets 7. In this state, the airflow flows to the outside of the housing 3 via one of the pair of air outlets 7.

At the other of the pair of air outlets 7, the other of the pair of covers 5 is pushed toward the outside of the housing 3 by the airflow. As a result, the other of the pair of covers 5 rotates about its upper edge. Therefore, the other of the pair of covers 5 is brought into an opened state with respect to the other of the pair of air outlets 7. In this state, the airflow flows to the outside of the housing 3 via the other of the pair of air outlets 7.

As illustrated in FIG. 3, in a case where wind from the front side of the housing 3 is strong, the above-mentioned airflow is weaker than airflow moving from the outside of the housing 3 toward one of the pair of air outlets 7.

At this time, at one of the pair of air outlets 7, one of the pair of covers 5 is pushed toward the inside of the housing 3 by the wind. As a result, one of the pair of covers 5 is pressed against one of the pair of air outlets 7. Therefore, one of the pair of covers 5 is brought into a closed state with respect to one of the pair of air outlets 7. In this state, the airflow does not go out via one of the pair of air outlets 7 to the outside of the housing 3.

At the other of the pair of air outlets 7, the other of the pair of covers 5 is pushed toward the outside of the housing 3 by the airflow. As a result, the other of the pair of covers 5 rotates about its upper edge. Therefore, the other of the pair of covers 5 is brought into an opened state with respect to the other of the pair of air outlets 7. In this state, the airflow goes out via the other of the pair of air outlets 7 to the outside of the housing 3.

As illustrated in FIG. 4, in a case where wind from the rear side of the housing 3 is strong, the above-mentioned airflow is weaker than airflow moving from the outside of the housing 3 toward the other of the pair of air outlets 7.

At this time, at one of the pair of air outlets 7, one of the pair of covers 5 is pushed toward the outside of the housing 3 by the airflow. As a result, one of the pair of covers 5 rotates about its upper edge. Therefore, one of the pair of covers 5 is brought into an opened state with respect to one of the pair of air outlets 7. In this case, part of the airflow goes out via one of the pair of air outlets 7 to the outside of the housing 3.

At the other of the pair of air outlets 7, the other of the pair of covers 5 is pushed toward the inside of the housing 3 by the wind. As a result, the other of the pair of covers 5 is pressed against the other of the pair of air outlets 7. Therefore, the other of the pair of covers 5 is brought into a closed state with respect to the other of the pair of air outlets 7. In this case, the airflow does not go out via the other of the pair of air outlets 7 to the outside of the housing 3.

According to the first embodiment described above, when the airflow from the fan 4 is weaker than the airflow moving from the outside of the housing 3 toward the air outlet 7 of the housing 3, the cover 5 is brought into a closed state with respect to the air outlet 7. Therefore, it is possible to suppress air from flowing back into the housing 3 without increasing the rotation speed of the fan 4.

At this time, no active device such as an actuator is required. Therefore, the power conversion device 1 that is highly reliable and low in cost can be realized.

Second Embodiment

Figure 5:
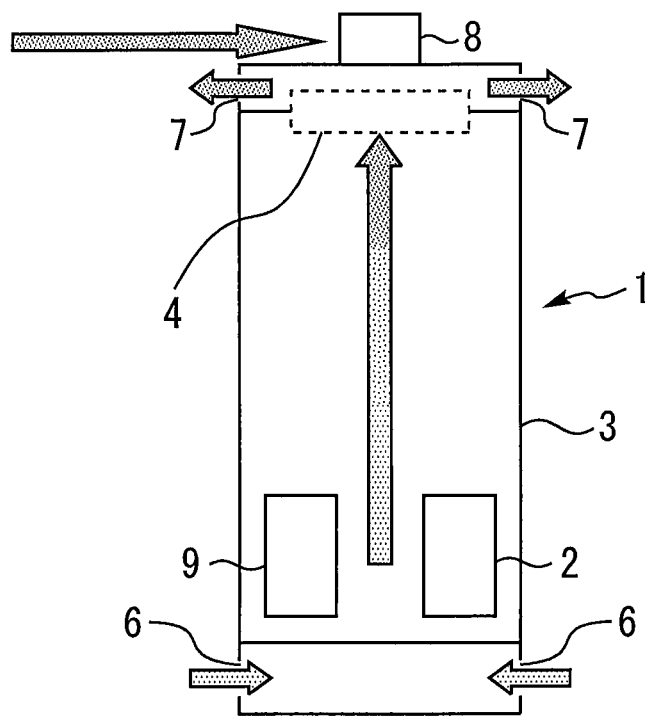
FIG. 5 is a diagram illustrating a longitudinal section of an essential part of a power conversion device according to a second embodiment of the present invention.
Figure 6:
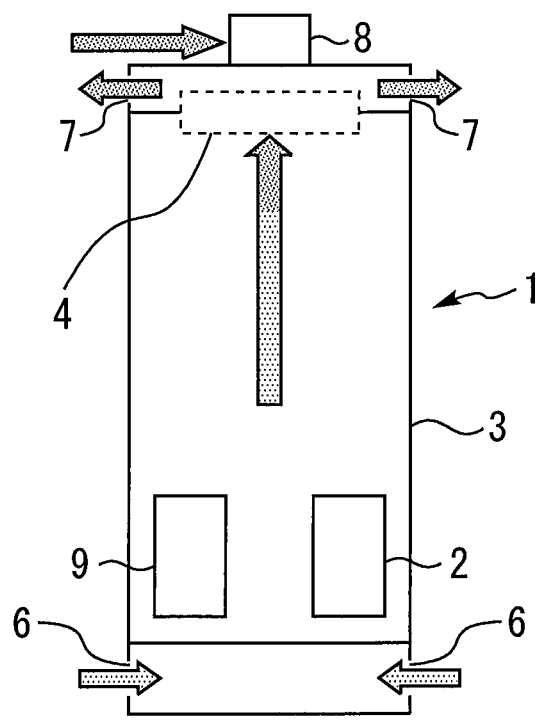
FIG. 6 is a diagram illustrating a longitudinal section of the essential part of the power conversion device according to the second embodiment of the present invention.

FIGS. 5 and 6 are diagrams each illustrating a longitudinal section of an essential part of a power conversion device according to a second embodiment of the present invention. In the drawings, the same or corresponding parts as those in the first embodiment are denoted by the same reference numerals. Explanations of these parts will be omitted.

As illustrated in FIGS. 5 and 6, in the second embodiment, the power conversion device 1 does not have the covers 5. The power conversion device 1 includes a wind speed measurement device 8 and a control device 9.

The wind speed measurement device 8 is provided outside the housing 3. For example, the wind speed measurement device 8 is provided on the upper surface of the housing 3.

The control device 9 is provided inside the housing 3. For example, the control device 9 is provided on the other side of the housing 3. An input part of the control device 9 is electrically connected to an output part of the wind speed measurement device 8. An output part of the control device 9 is electrically connected to an input part of the fan 4.

The wind speed measurement device 8 measures the wind speed outside the housing 3. When the wind speed measurement device 8 measures the wind speed, the control device 9 controls the rotation speed of the fan 4 based on the wind speed.

For example, as illustrated in FIG. 5, when the wind speed increases, the control device 9 increases the rotation speed of the fan 4. As a result, an appropriate amount of air flows out via the pair of air outlets 7 to the outside of the housing 3.

For example, as illustrated in FIG. 6, when the wind speed decreases, the control device 9 decreases the rotation speed of the fan 4. As a result, an appropriate amount of air flows out via the pair of air outlets 7 to the outside of the housing 3.

Next, the control device 9 will be described with reference to FIG. 7.

Figure 7:
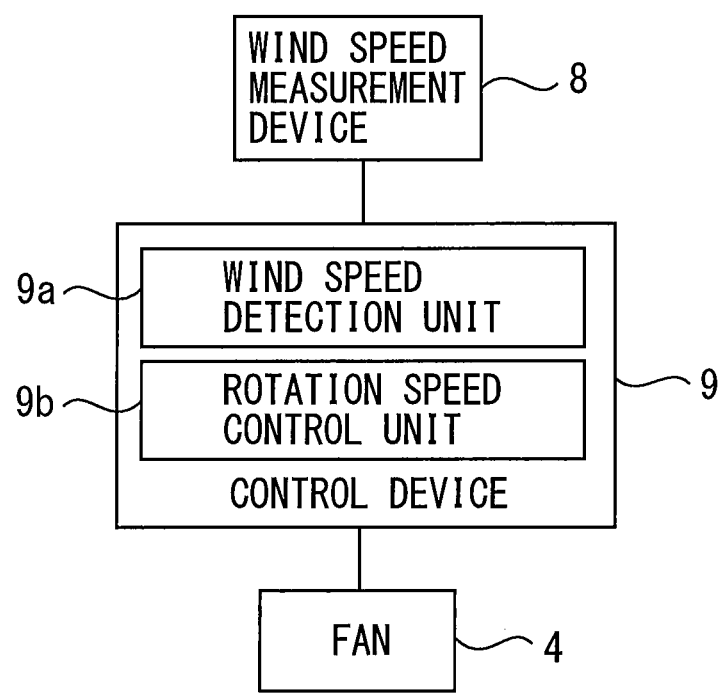
FIG. 7 is a block diagram illustrating a control device of the power conversion device according to the second embodiment of the present invention.

FIG. 7 is a block diagram illustrating the control device of the power conversion device according to the second embodiment of the present invention.

As illustrated in FIG. 7, the control device 9 includes a wind speed detection unit 9a and a rotation speed control unit 9b.

The wind speed detection unit 9a detects the wind speed measured by the wind speed measurement device 8. The rotation speed control unit 9b controls the rotation speed of the fan 4 based on the wind speed detected by the wind speed detection unit 9a.

Next, an operation of the control device 9 will be schematically illustrated with reference to FIG. 8.

Figure 8:
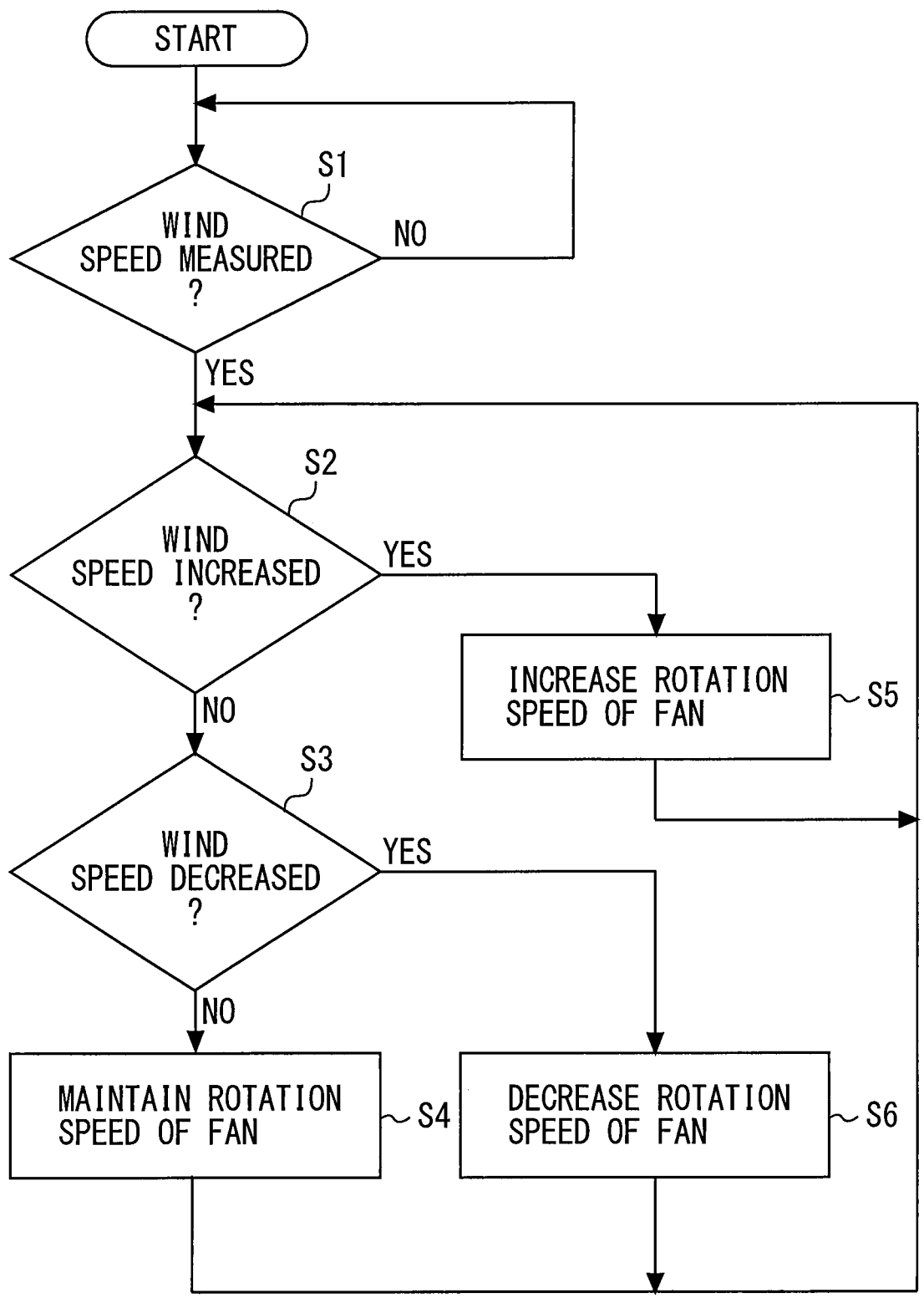
FIG. 8 is a flowchart schematically illustrating an operation of the control device of the power conversion device according to the second embodiment of the present invention.

FIG. 8 is a flowchart schematically illustrating the operation of the control device of the power conversion device according to the second embodiment of the present invention.

In step S1, the control device 9 determines whether the wind speed measurement device 8 has measured the wind speed. When the wind speed measurement device 8 has not measured the wind speed in step S1, the control device 9 performs the operation of step S1. When the wind speed measurement device 8 has measured the wind speed in step S1, the control device 9 performs an operation of step S2.

In step S2, the control device 9 determines whether the wind speed measured by the wind speed measurement device 8 has increased.

When the wind speed measured by the wind speed measurement device 8 has not increased in step S2, the control device 9 performs an operation of step S3. In step S3, the control device 9 determines whether the wind speed measured by the wind speed measurement device 8 has decreased.

When the wind speed measured by the wind speed measurement device 8 has not decreased in step S3, the control device 9 performs an operation of step S4. In step S4, the control device 9 maintains the rotation speed of the fan 4. Subsequently, the control device 9 performs the operation of step S2.

When the wind speed measured by the wind speed measurement device 8 has increased in step S2, the control device 9 performs an operation of step S5. In step S5, the control device 9 increases the rotation speed of the fan 4. Subsequently, the control device 9 performs the operation of step S2.

When the wind speed measured by the wind speed measurement device 8 has decreased in step S3, the control device 9 performs an operation of step S6. In step S6, the control device 9 decreases the rotation speed of the fan 4. Subsequently, the control device 9 performs the operation of step S2.

According to the second embodiment described above, when the wind speed measurement device 8 has measured the wind speed, the control device 9 controls the rotation speed of the fan 4 based on the wind speed. Therefore, it is possible to suppress air from flowing back into the housing 3 without excessively increasing the rotation speed of the fan 4. As a result, the lifetime of the fan 4 can also be prolonged.

Next, an example of the control device 9 will be described with reference to FIG. 9.

Figure 9:
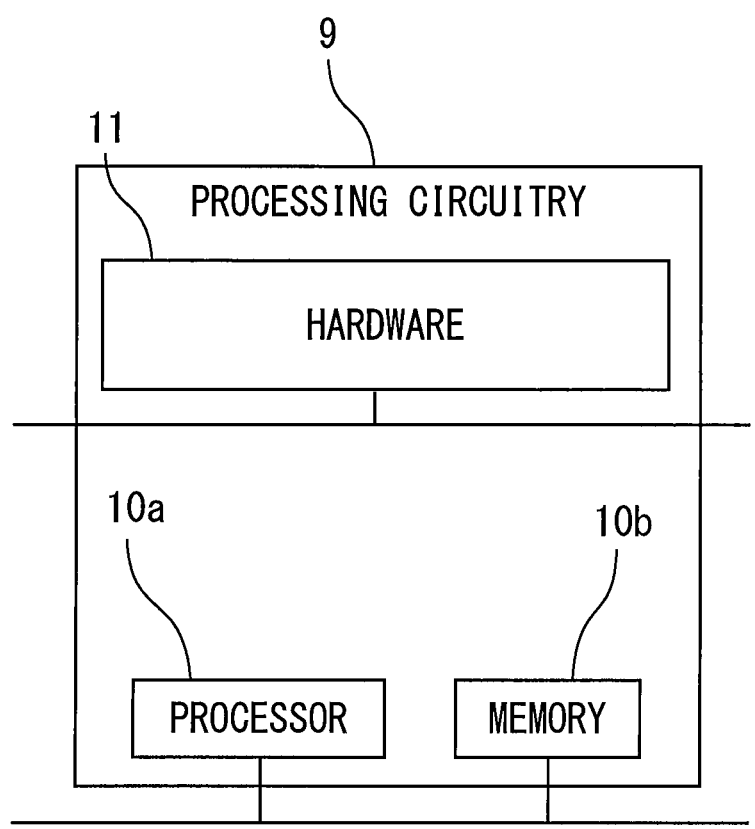
FIG. 9 is a diagram illustrating a hardware configuration of the control device of the power conversion device according to the second embodiment of the present invention.

FIG. 9 is a diagram illustrating a hardware configuration of the control device of the power conversion device according to the second embodiment of the present invention.

Each function of the control device 9 can be realized by a processing circuitry. For example, the processing circuitry includes at least one processor 10a and at least one memory 10b. For example, the processing circuitry includes at least one dedicated hardware 11.

When the processing circuitry includes the at least one processor 10a and the at least one memory 10b, each function of the control device 9 can be realized by software, firmware, or a combination of software and firmware. At least one of the software and the firmware is described as a program. At least one of the software and the firmware is stored in the at least one memory 10b. The at least one processor 10a realizes each function of the control device 9 by reading and executing the program stored in the at least one memory 10b. The at least one processor 10a may be referred to as a central processing unit (CPU), a central processor, a processor, an arithmetic unit, a microprocessor, a microcomputer, or a DSP. For example, the at least one memory 10b is a nonvolatile or volatile semiconductor memory such as RAM, ROM, flash memory, EPROM, or EEPROM, a magnetic disk, a flexible disk, an optical disk, a compact disk, a mini disk, a DVD, or the like.

When the processing circuitry includes the at least one dedicated hardware 11, the processing circuitry can be realized by, for example, a single circuit, a composite circuit, a programmed processor, a parallel programmed processor, ASIC, FPGA, or a combination thereof. For example, each function of the control device 9 can be respectively realized by the processing circuitry. For example, each function of the control device 9 can be collectively realized by the processing circuitry.

Part of each function of the control device 9 may be realized by the dedicated hardware 11 and the rest may be realized by software or firmware. For example, functions of the wind speed detection unit 9a may be realized by the processing circuitry as the dedicated hardware 11, and functions other the functions of the wind speed detection unit 9a may be realized by the at least one processor 10a reading and executing the program stored in the at least one memory 10b.

In this manner, the processing circuitry realizes each function of the control device 9 by the hardware 11, software, firmware, or a combination thereof.

In the power conversion device 1 described in the first embodiment, the control device 9 according to the second embodiment may be used. In this case, even when the cover 5 is broken, it is possible to suppress air from flowing back into the housing 3 without excessively increasing the rotation speed of the fan 4.

Further, the positions of the air inlets 6 and the air outlets 7 may be appropriately set. For example, the air inlets 6 may be provided at an upper portion of the housing 3. At this time, the air outlets 7 may be provided at a lower portion of the housing 3. In this case, inflow of dusts from the ground can be prevented.

INDUSTRIAL APPLICABILITY

As mentioned above, the power conversion device according to the present invention can be used for a system suppressing air from flowing back into the housing.

REFERENCE SIGNS LIST

1 Power conversion device
2 Power conversion unit
3 Housing
4 Fan
5 Cover
6 Air inlet
7 Air outlet
8 Wind speed measurement device
9 Control device
9a Wind speed detection unit
9b Rotation speed control unit
10a Processor
10b Memory
11 Hardware

The invention claimed is:

1. A power conversion device comprising:
a power conversion unit configured to perform power conversion;
a housing accommodating the power conversion unit and having an air inlet and an air outlet,
a fan provided inside the housing to generate airflow in such a manner that air flows to outside of the housing via the air outlet after flowing into the housing via the air inlet;
a cover provided at the air outlet, the cover being configured to be brought into an opened state with respect to the air outlet if the airflow generated by the fan is stronger than airflow moving from the outside of the housing toward the air outlet, and to be brought into a closed state with respect to the air outlet if the airflow generated by the fan is weaker than the airflow moving from the outside of the housing toward the exhaust of the housing;
a wind speed measurement device configured to measure a wind speed outside the housing, and
a control device configured to, when the wind speed measurement device has measured the wind speed, control the rotation speed of the fan based on the wind speed.

2. A power conversion device comprising:
a power conversion unit configured to perform power conversion,
a housing accommodating the power conversion unit and having an air inlet and an air outlet,
a fan provided inside the housing to generate airflow in such a manner that air flows to the outside of the housing via the air outlet after flowing into the housing via the air inlet,
a wind speed measurement device configured to measure a wind speed outside the housing, and
a control device configured to, when the wind speed measurement device has measured the wind speed, control the rotation speed of the fan based on the wind speed.

3. The power conversion device according to claim 1, wherein the control device is further configured to, when the wind speed measurement device has measured an decrease in the wind speed, control the rotation speed of the fan based on the wind speed to decrease.

* * * * *